US012028055B2

(12) United States Patent
Porter et al.

(10) Patent No.: US 12,028,055 B2
(45) Date of Patent: Jul. 2, 2024

(54) VARIABLE RESISTOR WITH T-COIL INTEGRATED SWITCHES FOR PARASITIC MITIGATION

(71) Applicant: SEMTECH CORPORATION, Camarillo, CA (US)

(72) Inventors: Steven Greig Porter, Ottawa (CA); Stanley Jeh-Chun Ma, Ottawa (CA)

(73) Assignee: SEMTECH CORPORATION, Camarillo, CA (US)

( * ) Notice: Subject to any disclaimer, the term of this patent is extended or adjusted under 35 U.S.C. 154(b) by 0 days.

(21) Appl. No.: 17/963,084

(22) Filed: Oct. 10, 2022

(65) Prior Publication Data

US 2024/0120912 A1    Apr. 11, 2024

(51) Int. Cl.
*H04L 25/02* (2006.01)
*H03H 11/28* (2006.01)
*H03K 17/16* (2006.01)

(52) U.S. Cl.
CPC ........... *H03K 17/161* (2013.01); *H03H 11/28* (2013.01); *H04L 25/0278* (2013.01)

(58) Field of Classification Search
CPC ............. H03K 17/161; H03K 19/0005; H03K 19/017545; H03K 17/687; H03K 19/018557; H03H 11/28; H03H 7/38; H03H 2001/0078; H03H 2210/028; H03H 7/0115; H03H 7/1766; H03H 7/465; H04L 25/0278
See application file for complete search history.

(56) References Cited

U.S. PATENT DOCUMENTS

2022/0077559 A1\*  3/2022  Seki ................. H01P 5/185

OTHER PUBLICATIONS

B. Razavi, "The Bridged T-Coil [A Circuit for All Seasons]," in IEEE Solid-State Circuits Magazine, vol. 7, No. 4, pp. 9-13, Fall 2015, doi: 10.1109/MSSC.2015.2474258.
E. L. Ginzton, W. R. Hewlett, J. H. Jasberg and J. D. Noe, "Distributed Amplification," in Proceedings of the IRE, vol. 36, No. 8, pp. 956-969, Aug. 1948, doi: 10.1109/JRPROC.1948.231624.

\* cited by examiner

*Primary Examiner* — Jung Kim
(74) *Attorney, Agent, or Firm* — Morgan, Lewis & Bockius LLP

(57) ABSTRACT

A signal driver may include a variable termination resistor and a signal transmission line. The variable termination resistor may include one or more variable termination resistor units. Each of the one or more variable termination resistor units may include a switch connected to a first end node of the variable termination resistor; a T-coil connected to the switch; a first resistor connected to the first end node of the variable termination resistor and to the T-coil; and a second resistor connected to a second end node of the variable termination resistor and to the T-coil. The signal transmission line may be connected to the second end node of the variable termination resistor.

19 Claims, 8 Drawing Sheets

VARIABLE RESISTOR WITH T-COIL INTEGRATED SWITCHES FOR PARASITIC MITIGATION

BACKGROUND

A signal driver often includes multiple output stages to process incoming signals for a load and one or more termination resistors. To adjust the values of the termination resistors, switches are often included in the termination resistors. The parasitic capacitance of the switches may impact the impedance of the termination resistors which may result in degraded high frequency response and output return loss. Such implementations suffer from a limited bandwidth and decreased return loss at high frequencies.

In a signal driver, achieving sufficient inductance to mitigate the driver output capacitance has been problematic. In some approaches, routing is made thinner to increase the inductance, which may compromise the direct current (DC) resistance and electromigration in the transmission line. For example, electromigration may be acceptable only up to a certain temperature, and DC resistance affects the impedance matching and loss. In some approaches, shunt resistors are added to maintain the impedance matching which requires additional routing in the signal driver and increases power consumption. Even if sufficient inductance can be achieved, the inductance does not provide wideband flat frequency response and good wideband return loss, due to the frequency dependent nature of an inductor. For data communications where a significantly wide bandwidth is required, improved signal drivers are needed.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

The accompanying drawings, which are included to provide a further understanding of the disclosure, are incorporated in and constitute a part of this disclosure, illustrate embodiments of the disclosure, and together with the description serve to explain principles of the disclosure.

Figure 1:
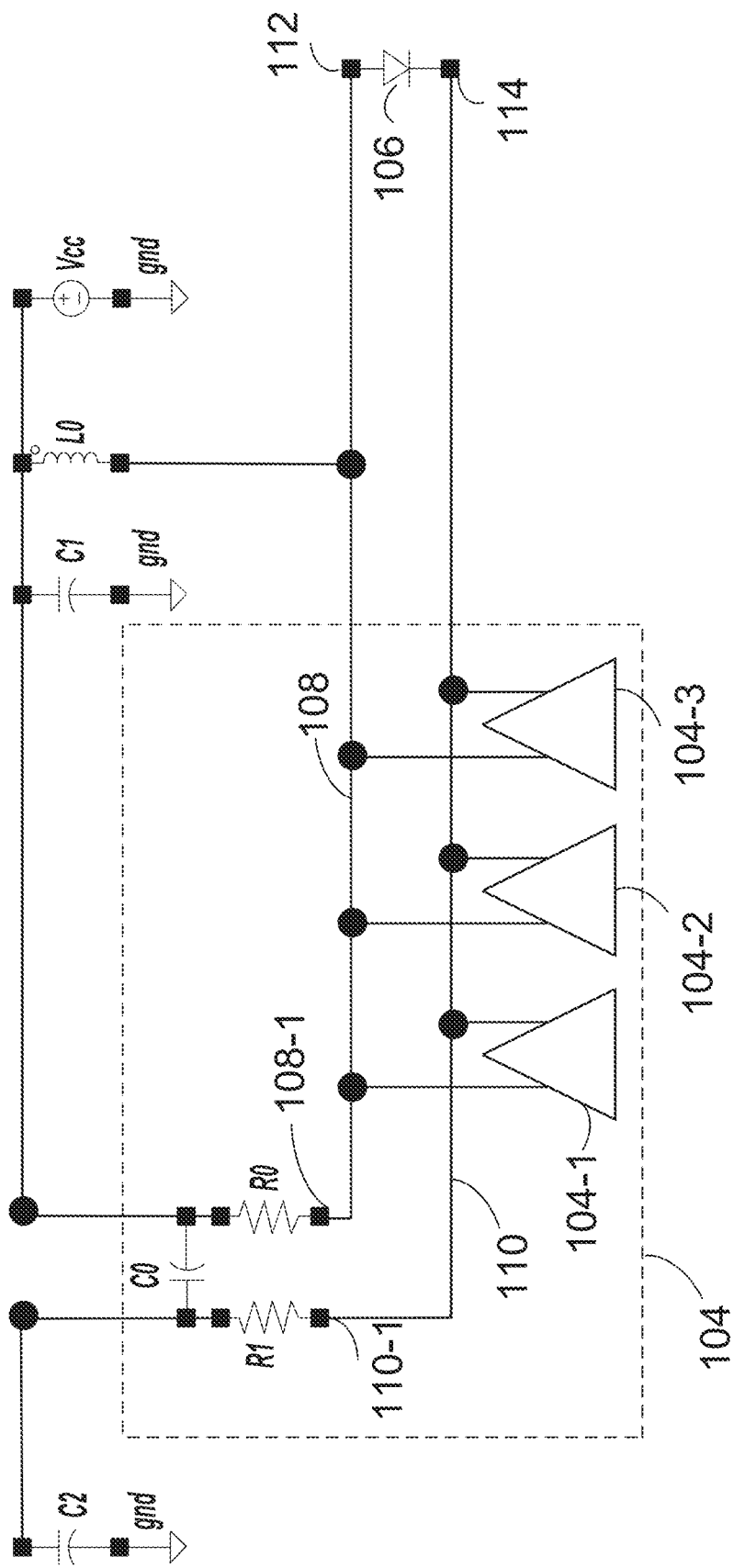
FIG. 1 illustrates a diagram of an example signal driver with termination resistors.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The present description relates to semiconductor integrated circuits, including, without limitation, a termination resistor stage with application of tee-coils (T-coils) to switches for parasitic mitigation to improve bandwidth and return loss.

In one or more aspects, high performance metal oxide semiconductor field effect transistor (MOSFET) switches may be implemented by adding T-coils (coupled inductors) to mitigate parasitics (such as the parasitic capacitance) of the switches. When the MOSFET switch is on, the MOSFET switch may be operating in a linear region.

Switches are implemented in a wide range of applications. For example, where adjustable or programmable resistors are desired, switches may often be added to increase or decrease the net resistance of a resistor network, either for a particular designed application or to compensate for the resistor manufacturing variation. These switches usually have parasitics, including parasitic capacitance which may reduce the bandwidth of the circuit. The parasitic capacitance may also impact performance metrics such as the transfer function and return loss.

In one or more implementations, including a T-coil to a variable resistor switch circuit may greatly improve the performance. For example, the T-coil integrated variable resistor circuit may have increased bandwidth compared with other bandwidth extension and parasitic mitigation techniques. In addition, the T-coil integrated variable resistor circuit may improve the return loss to even higher frequencies. The measurement of the amount of power reflected back toward the source is defined as return loss in decibels (dB). The return loss is always a positive number, and a high return loss indicates less power is reflected from a load and is a favorable measurement that generally correlates to a low insertion loss.

In one or more implementations, the T-coil may include two coupled inductors, L1 and L2, with a coupling factor k, and capacitance Cb between the two inductors. One end of each inductor may be connected together to the switch parasitic capacitance. The other ends of the inductors may be connected separately to the other components of the circuit that otherwise would have been connected to the switch.

In one or more aspects, the implementation of the subject technology may be applied in various configurations, such as a programmable resistor or a variable resistor. In one or more implementations, multiple units in parallel including T-coils and switches may be used to achieve the desired amount of resolution/precision and a range of adjustable resistance.

In one or more aspects, the implementation of the subject technology may mitigate unwanted parasitic capacitance in MOSFET switches.

FIG. 1 illustrates a diagram of an example signal driver with termination resistors.

In some approaches, all the output nodes of a signal driver may be connected at one point, which may introduce large capacitance. In one or more aspects, the term "distributed" may mean instead of connecting all the output nodes from various output taps to one point, the output nodes are distributed along a transmission line, so that output nodes may be connected at different points along the transmission line. In some approaches, typically only a single driver may be used in a signal driver.

As shown in FIG. 1, a signal driver 104 may include a plurality of distributed drivers 104-1, 104-2, and 104-3. The plurality of distributed drivers may be more than the three distributed drivers shown in FIG. 1. The plurality of distributed drivers 104-1, 104-2, and 104-3 may be distributed along and connected to a transmission line 108 which may be connected to an anode node 112 on an anode side of a load 106. In some examples, the load 106 may be a directly modulated laser (DML). In some examples, the load 106 may be a variety of loads, such as a resistive load, a conducting/connection line, or an antenna. In one or more examples, a transmission line may be a metal line or metal strip on a chip. In some exemplary applications, a transmission line may not be required, especially for applications where the distances between the main components are small compared to the wavelength of the highest frequency of interest. The plurality of distributed drivers 104-1, 104-2, and 104-3 may also be distributed along and connected to a transmission line 110 which may be connected to a cathode node 114 on a cathode side of the load 106. The output signals from the plurality of distributed drivers 104-1, 104-2, and 104-3 may be summed along the transmission lines 108 and 110, respectively. The two transmission lines 108 and 110 may provide differential outputs. The signal driver 104 may be configured to transmit/receive signals from a data/signal transmission network to the load 106. The plurality of distributed drivers may be substantially similar in structure and function for each of the transmission lines 108 and 110.

In some aspects, the distributed drivers shown in FIG. 1 may mitigate the effect of driver output capacitance. In one or more aspects, the signal driver 104 may need to drive one or more output devices as the load 106 uses one or more output stages (not shown in FIG. 1). Those output stages may require a large amount of power and may also introduce parasitic capacitance at the input nodes and output nodes of the output stages. The introduced parasitic capacitance may reduce the bandwidth and increase the loss of the transmission data. In one or more improved aspects as shown in FIG. 1, the one or more output stages may be separated into a plurality of distributed drivers 104-1, 104-2, 104-3, and so on, distributed along the transmission lines 108 and 110 to reduce the capacitance per distributed driver. In some examples, inductance may also be introduced to combine with the capacitance on the distributed drivers to form an inductor-capacitor filter (LC filter) for each of the distributed drivers (not shown in FIG. 1). However, such LC filters may have a deteriorated response at high frequencies. As the signal passes through the transmission lines, the signal on the high frequency range may be lost during the transmission.

In one or more implementations, the signal driver 104 may include termination resistors R0 and R1 and a capacitor C0 formed at both ends of the termination resistors R0 and R1. In one or more examples, one end 108-1 of the transmission line 108 opposite to the anode node 112 may be coupled to a supply voltage Vcc through the termination resistor R0. The supply voltage Vcc may be a direct current (DC) bias voltage. In some examples, a ferrite L0 may also be connected to the supply voltage Vcc and to the anode node 112. A capacitor C1 may be connected to the supply voltage Vcc and to the ground (gnd). In one or more examples, one end 110-1 of the transmission line 110 opposite to the cathode node 114 may be coupled to the ground through the termination resistor R1 and a capacitor C2.

In one or more examples, the resistance of the termination resistors (e.g., termination resistors R0 and R1) may be programmable to accommodate the variations in the signal driver 104 and the resistor tolerance range required by the manufacturing specification. In some approaches, the resistance of the termination resistors may be varied by turning on and off a number of switches connected to a number of resistors (not shown in FIG. 1). However, the switches may have large parasitic capacitance. When the signal from the signal driver 104 is close to a high frequency range, for example, close to 12 GHz, the parasitic capacitance of the switches dominates that may reduce the bandwidth of the signal and increase the loss of the signal driver 104. In one or more aspects, when the switches are controlled to change the resistance of a termination resistor (e.g., termination resistors R0 or R1), the impedance of this termination do not change. The impedance of the termination may remain constant because the capacitance of the switch may be the most significant factor for impedance, and the other factors may not have a significant impact on the impedance as compared to the capacitance of the switches.

In one or more examples, the distributed drivers, transmission line, and termination resistors as shown in FIG. 1 may be single-ended (e.g., connected to only one transmission line without the differential signal) in other applications.

Figure 2:
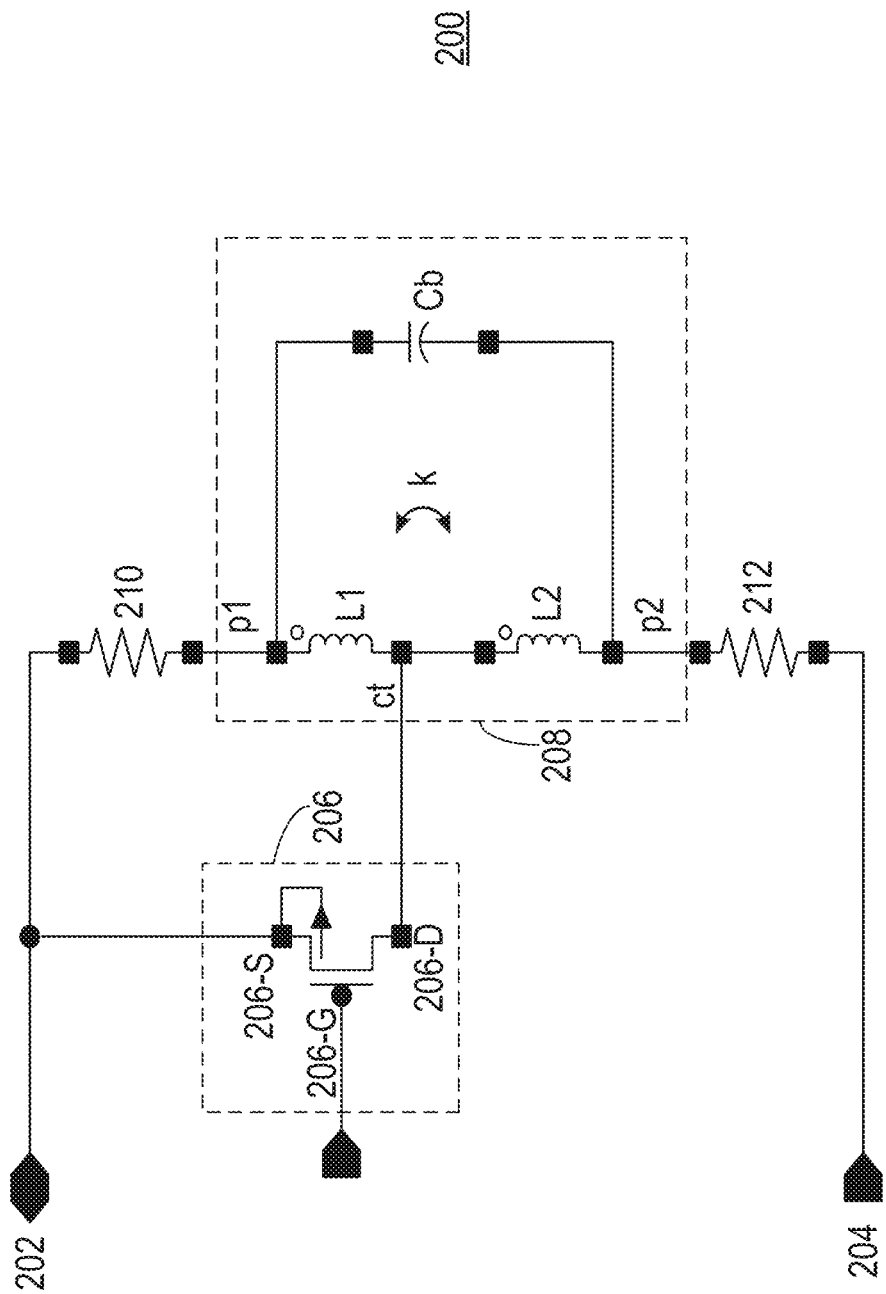
FIG. 2 illustrates a circuit diagram of an example variable termination resistor implemented by a switch and a tee-coil (T-coil).

FIG. 2 illustrates a circuit diagram of an example variable termination resistor implemented by a switch and a T-coil.

In some approaches, a variable termination resistor may be implemented with various configurations of resistors and switches to adjust the resistance. In one or more implementations of the subject technology, T-coils may be integrated with the switches and resistors within the variable termination resistor, to improve the bandwidth and the return loss for various frequency ranges, including a high frequency range (e.g., equal to or greater than 10 GHz).

In one or more examples, a variable termination resistor 200 may replace the termination resistor R1 or R0 in FIG. 1. When the variable termination resistor 200 replaces the termination resistor R1, one end node 202 of the variable termination resistor 200 may be connected to the ground. The other end node 204 of the variable termination resistor 200 may be connected to the transmission line (e.g., the transmission line 110 of FIG. 1) which transmits signals. When the variable termination resistor 200 replaces the termination resistor R0, one end node 202 of the variable termination resistor 200 may be connected to the supply voltage Vcc. The other end node 204 of the variable termination resistor 200 may be connected to the transmission line (e.g., the transmission line 108 of FIG. 1) which transmits signals.

In one or more of examples, the variable termination resistor 200 may include a switch 206. The switch 206 may be implemented as a MOSFET when the MOSFET operates between the cut-off and linear regions. The ON and OFF states of the switch 206 may be controlled by the gate 206-G of the MOSFET. The gate 206-G of the switch 206 may be controlled by a gain control or a feedback signal from the signal driver 104. In one or more examples, as shown in FIG. 2, the switch 206 may be a P channel MOSFET with the source 206-S connected to the end node 202 to the ground, and the drain 206-D connected to a center tap terminal ct of a T-coil 208. In some examples, the switch 206 may be an N channel MOSFET in another circuit design.

The T-coil 208 may have a three-terminal structure. The terminals may include a first terminal p1, a second terminal p2, and a center tap terminal ct (e.g., a switch node). The terms terminal, port or/and node may be used interchangeably. In some examples, the T-coil 208 may include an inductor that is center-tapped that includes a first inductor portion L1 and a second inductor portion L2. In some examples, the T-coil 208 may include two inductors L1 and L2 that are connected with a center tap. In some examples, the two inductors L1 and L2 may overlap to allow a compact layout. The terms inductors L1 and L2, and inductor portions L1 and L2 may be used interchangeably herein. The T-coil 208 may include a bridge capacitor Cb, which may be formed due to electrical coupling between two inductors L1 and L2 (at the first and second terminals p1 and p2, respectively) of the T-coil 208. In some examples, the bridge capacitor Cb may be a parasitic capacitor formed by the electrical coupling of L1 and L2. In some examples, the bridge capacitor Cb may be an explicitly implemented capacitor with specific capacitance (e.g., extrinsic capacitance rather than intrinsic capacitance). In one or more examples, L1 and L2 may be designed so that the parasitic capacitance Cb between the L1 and L2 is in a desired value. The dimensions of the metal of L1 and L2 may determine the suitable Cb capacitance. In case when no large enough parasitic capacitance (or intrinsic capacitance) is created between the L1 and L2, an actual bridge capacitor Cb may need to be added explicitly.

In some examples, the inductance of the inductors L1 and L2 may be substantially the same. In some examples, the inductance of the inductors L1 and L2 may be different and optimized independently. The T-coil characteristics may depend on the values of the inductances of inductors L1, L2, and the coupling coefficient k between the inductors L1 and L2, which may be based at least in part on the layout and shape of the T-coil. In some examples, the coupling coefficient k may be about 0.4 due to the physical implementation limitations on a chip. In some examples, the coupling coefficient k may be higher than 0.4 in other applications. In some examples, k is greater than 0 and less than 1. The value of k may be optimized to achieve the desired return loss and frequency response with a value around 0.3 to 0.7. In some implementations, the values of the inductors L1 and L2 are within a range of about 10 to 1000 pico-Henry (pH), and the value of the bridge capacitor Cb is within a range of about 0.1-200 femto-Farad (fF).

Simplified equations for an ideal T-coil component values may be as follows:

$$L1 = L2 = 1/(1+k)*Cp*Zo^2,$$

$$Cb = 0.25*(1-k)/(1+k)*Cp$$

wherein Cb is the parasitic capacitance of the bridge capacitor Cb; L1 and L2 are the inductances of the inductors L1 and L2 respectively; Cp is the capacitance on the center tap terminal ct; k is the inductor coupling coefficient; and Zo is the impedance of the connection line that may be the resistance of a resistor 210, and may be often dictated by an application requirement.

L1, L2 and Cb may change based on the capacitance Cp on the center tap terminal ct, which may be the (parasitic) capacitance of the switch 206. The capacitance of the switch 206 may be based on the size of the switch 206. The inductance of L1 or L2 may be determined partially by the coupling coefficient k. The higher the coupling coefficient k, the less the inductance of L1 or L2 needed to achieve an implementation requirement.

In one or more examples, the T-coil 208 may be placed close to the parasitic capacitance of the switch (e.g., 206) to minimize the parasitic inductance between the center tap terminal ct of the T-coil and the switch. In some examples, the inductance of L1 or L2 may be implemented with a straight-line track, or with a looped coil although other implementations are possible.

In one or more examples, the first terminal p1 of the T-coil 208 may be connected to the resistor 210 at one end. The other end of the resistor 210 may be connected to the end node 202 of the variable termination resistor 200. The second terminal p2 of the T-coil 208 may be connected to a resistor 212 at one end. The other end of the resistor 212 may be connected to the end node 204 of the variable termination resistor 200.

Without a T-coil 208, the impedance of the variable termination resistor 200 when the switch 206 is on may be determined by the parallel connected resistance of the resistor 210 and the parasitic capacitance of the switch 206, in series with the resistance of the resistor 212.

The parasitic capacitance of the switch 206 may degrade the bandwidth and high frequency impedance of the signal driver 104. In one or more examples, the T-coil 208 may mitigate the parasitic capacitance of the switch 206, so that the parasitic capacitance of the switch 206 may not be dominant within the variable termination resistor 200. An ideal T-coil may make the bandwidth and impedance ideal for high frequencies.

In one or more examples, a T-coil may have a fixed impedance on either side of p1 and p2. The impedances on both sides of the T-coil may be the same and predetermined.

When the switch 206 is turned on, the impedance of the variable termination resistor 200 may be determined by the resistances of the resistor 210 and the resistor 212, and the resistance of the switch 206. In this case, the parasitic capacitance of the switch 206 may not have a significant impact on the impedance of the variable termination resistor 200 and may be ignored relative to the resistances. The impedance of the variable termination resistor 200 may be determined by the parallel-connected resistance of the resistor 210 and the resistance of the switch 206, in series with the resistance of the resistor 212. In some examples, the resistance of the switch 206 may be substantially the same or comparable with the resistance of the resistor 210, the impedance of the variable termination resistor 200 may be half of the resistance of the resistor 210, in series with the resistance of the resistor 212. In some examples, when the resistance of the switch 206 is relatively small compared with the resistance of the resistor 210, the impedance of the variable termination resistor 200 may be determined by the resistance of the resistor 212 alone.

When the switch 206 is turned off, the impedance of the variable termination resistor 200 may be determined by the resistances of the resistor 210 in series with the resistor 212. In this case, the parasitic capacitance of the switch 206 may be mitigated by the T-coil 208. The resistance of the switch 206 may be relatively large (for example, equal to infinity) compared with the resistance of the resistor 210. The resistance of the switch 206 may be ignored in a parallel connection.

Two variable resistance states may be achieved when the switch 206 is off and on.

When the resistance of the resistor 212 is large relative to the resistor of the switch 206 (e.g., 5-10 times large or more), the approximate range of the variable resistance/impedance of the variable termination resistor 200 may be between the resistance of the resistor 212 and the total resistance of the resistor 210 in series with the resistor 212. When a wide tuning range is desired, the resistance of the resistor 210 may be larger than the resistance of the resistor 212. When a small tuning range is desired, the resistance of the resistor 210 may be smaller than the resistance of the resistor 212. In some examples, the relative resistance ratio of the resistor 210 and the resistor 212 may be adjusted to meet a −15% to 15% tuning range (e.g., 85% to 115% relative to a middle resistance) to compensate for a manufacturing tolerance of the variable termination resistor 200.

In one or more examples, the resistors 210 and 212 may be made of polysilicon with low sheet resistivity. In one or more examples, the resistance range for the resistor 210 may be from 15 ohms to 200 ohms. The resistance range for the resistor 212 may be from 20 ohms to 300 ohms. In one or more examples, the resistances of the resistors 210 and 212 may be fixed. In one example, the resistance for the resistor 210 may be 315 ohms, and the resistance for the resistor 212 may be 507 ohms.

Figure 3:
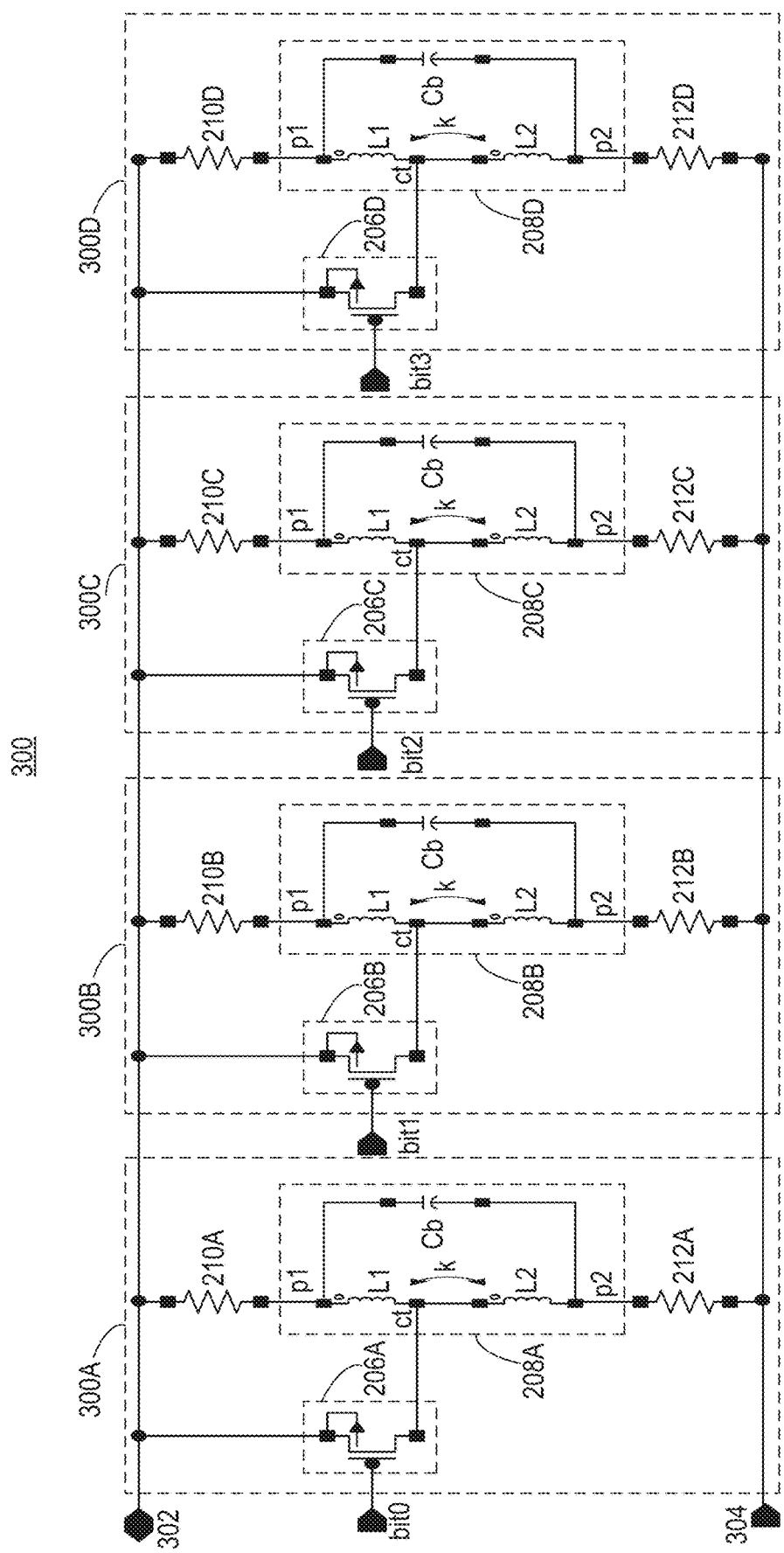
FIG. 3 illustrates a circuit diagram of an example variable termination resistor implemented by a plurality of variable termination resistor units comprising switches and T-coils.

FIG. 3 illustrates a circuit diagram of an example variable termination resistor implemented by a plurality of variable termination resistor units comprising switches and a T-coils.

In one or more examples, a variable termination resistor 300 may replace the termination resistor R1 or R0 in FIG. 1. When the variable termination resistor 300 replaces the termination resistor R1, one end node 302 of the variable termination resistor 300 may be connected to the ground. The other end node 304 of the variable termination resistor 300 may be connected to the transmission line (e.g., the transmission line 110 of FIG. 1) which transmits signals. When the variable termination resistor 300 replaces the termination resistor R0, one end node 302 of the variable termination resistor 300 may be connected to the supply voltage Vcc. The other end node 304 of the variable termination resistor 300 may be connected to the transmission line (e.g., the transmission line 108 of FIG. 1) which transmits signals.

The variable termination resistor 300 may include a plurality of variable termination resistor units. In one or more examples, the variable termination resistor 300 may include four variable termination resistor units 300A, 300B, 300C and 300D. In some other embodiments, the number of variable termination resistor units in the variable termination resistor 300 is not limited to 4 and may be dependent on the number of bits of a symbol in the signal stream. Each of the plurality of variable termination resistor units 300A, 300B, 300C and 300D may include substantially the same or similar structure and functionality as the variable termination resistor 200 as shown in FIG. 2. Each of the components within each of the variable termination resistor units 300A, 300B, 300C and 300D may include substantially the same or similar structure and functionality as each of the components within the variable termination resistor 200 of FIG. 2. For example, the variable termination resistor unit 300A may include substantially the same or similar resistor 210A, resistor 212A, switch 206A, and T-coil 208A as the resistor 210, resistor 212, switch 206, and T-coil 208, respectively.

In FIG. 3, each of the four variable termination resistor units 300A, 300B, 300C and 300D may be configured to process each bit of a 4-bit symbol in the signal stream. In one or more examples, the currently processed bit may be trimmed from the symbol and supplied to the gate of each of the switches 206A, 206B, 206C, and 206D. The output signal from each of the four variable termination resistor units 300A, 300B, 300C and 300D may be binary weighted at the end nodes 302 and 304 of the variable termination resistor 300.

In one or more examples, the resistances of the resistors (e.g. 210A, and 212A) and the resistance of the switch (e.g., 206A) of each of the variable termination resistor units (e.g., 300A) may be determined according to the current processed bit of the 4-bit symbol. A least significant bit (LSB) is the bit that is farthest to the right and holds the least value in a multi-bit binary number/symbol. The most significant bit (MSB) is the bit that is farthest to the left and holds the largest value in a multiple-bit binary number/symbol. In some examples, bit 0 to bit 3 represent the binary weighted inputs of a 4-bit symbol, with bit 0 as the least significant and bit 3 as the most significant bit. Bit 0 to bit 3 may be processed by each of the four variable termination resistor units 300A, 300B, 300C and 300D, respectively.

If the current processed bit of the 4-bit symbol is the LSB (e.g., bit 0), the resistances of the resistors (e.g., 210A, and 212A), and the resistance of the switch (e.g., 206A) of the variable termination resistor unit 300A may be the largest among the all the variable termination resistor units 300A, 300B, 300C and 300D. The inductances of the T-coil (e.g., 208A) for the variable termination resistor unit 300A may be the largest among the all the variable termination resistor units 300A, 300B, 300C and 300D.

If the current processed bit of the 4-bit symbol is the MSB (e.g., bit 3), the resistances of the resistors (e.g., 210D, and 212D) and the resistance of the switch (e.g., 206D) of the variable termination resistor unit 300D may be the smallest among the all the variable termination resistor units 300A, 300B, 300C and 300D. The inductance of the T-coil for the variable termination resistor unit 300D may be the smallest among the all the variable termination resistor units 300A, 300B, 300C and 300D.

If the current processed bit of the 4-bit symbol is the next left to the LSB (e.g., bit 1), the resistances of the resistors (e.g., 210B, and 212B) and the resistance of the switch (e.g., 206B) of the variable termination resistor unit 300B may be substantially half of the resistances of the resistors (e.g., 210A, and 212A) and the resistance of the switch (e.g., 206A) of the variable termination resistor unit 300A, respectively. For example, the resistance of the resistor 210A is 158 ohms, and the resistance of the resistors 212A is 254 ohms for the variable termination resistor unit 300A. The resistance of the resistor 210B is 79 ohms, and the resistance of the resistors 212B is 127 ohms for the variable termination resistor unit 300B. The resistance of the switch 206A of the variable termination resistor unit 300A is substantially twice of the resistance of the switch 206B of the variable termination resistor unit 300B. In one example, the channel length of the switch 206A is substantially twice the channel length of the switch 206B. In another example, the channel width of the switch 206B is substantially twice the channel width of the switch 206A. The inductance of the T-coil (e.g., 208B) of the variable termination resistor unit 300B may be substantially half of the inductance of the T-coil (e.g., 210A) of the variable termination resistor unit 300A.

Following the same pattern from bit 0 to bit 1, if the current processed bit of the 4-bit symbol is the next left to the bit1 (e.g., bit 2), the resistances of the resistors (e.g., 210C, and 212C) and the resistance of the switch (e.g., 206C) of the variable termination resistor unit 300C may be substantially half of the resistances of the resistors (e.g., 210B, and 212B) and the resistance of the switch (e.g., 206B) of the variable termination resistor unit 300B, respectively. The inductance of the T-coil (e.g., 208C) of the variable termination resistor unit 300C may be substantially half of the inductance of the T-coil (e.g., 210B) of the variable termination resistor unit 300B.

In one or more examples, the inductances L1 and L2 of the T-coil (e.g., 208A) of the variable termination resistor unit (e.g., 300A) may be proportional to the parasitic capacitance of the switch (e.g., 206A) multiplied by the resistance of the resistor (e.g., 210A) squared. The parasitic capacitance of the switch (e.g., 206A) may be inverse proportional to the resistance of the switch (e.g., 206A).

The resistances of the resistors (e.g., 210D, and 212D) and the resistance of the switch (e.g., 206D) of the variable termination resistor unit 300D may be substantially half of the resistances of the resistors (e.g., 210C, and 212C) and the resistance of the switch (e.g., 206C) of the variable termination resistor unit 300C, respectively. The inductance of the T-coil (e.g., 208D) of the variable termination resistor unit 300D may be substantially half of the inductance of the T-coil (e.g., 210C) of the variable termination resistor unit 300C.

Each of the variable termination resistor units 300A, 300B, 300C and 300D may be controlled individually by the signal on the gate of the switch to vary the individual resistance as a component of the total resistance of the variable termination resistor 300. In one or more examples, the variable termination resistor units 300A, 300B, 300C and 300D may have $2^4=16$ variable resistance states for a 4-bit symbol. An N variable termination resistor units may have $2^N$ variable resistance states for an N-bit symbol, and N is a natural number. In some examples, the resistance states of the variable termination resistor 300 may be adjusted/varied to meet a −15% to 15% tuning range (e.g., 85% to 115% relative to a middle resistance) to compensate for a manufacturing tolerance of the variable termination resistor 300. For a 4-bit symbol, to meet the −15% to 15% tuning range, $(15\%-(-15\%))/(16-1)=2\%$ of the step tuning range may be achieved for adjacent two variable resistance states for the four variable termination resistor units. In one or more examples, to achieve more or less control accuracy on the step tuning range, more or less number of variable termination resistor units may be implemented to meet a system requirements. A particular step tuning range may be achieved by adjusting the resistances of the resistors within the variable termination resistor units.

In one or more examples, the resistances of the resistors within the variable termination resistor units may also be determined by the middle resistance of the variable termination resistor 300. For example, when a load 106 is a laser, the middle resistance of the variable termination resistor 300 may be about 25 ohms. For other systems with different loads, the middle resistance requirement of the variable termination resistor 300 may be different.

In one or more examples, the layout of the variable termination resistor units from left to right in FIG. 3 may be in a different/any order with equivalent functionality.

Figure 4A:
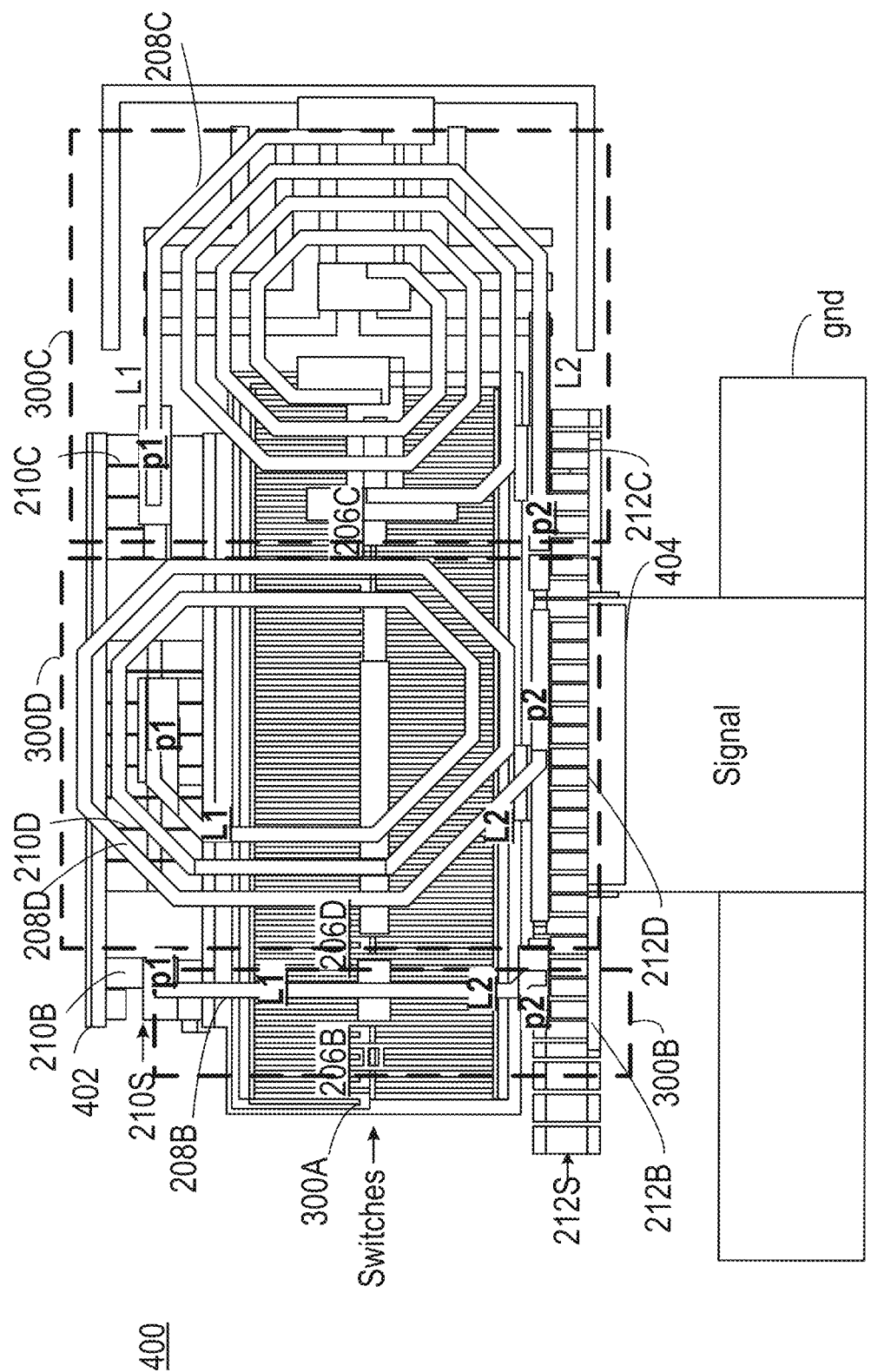
FIGS. 4A-4C illustrate a circuit layout diagram of an example variable termination resistor implemented by a plurality of variable termination resistor units comprising switches and T-coils.
Figure 4B:
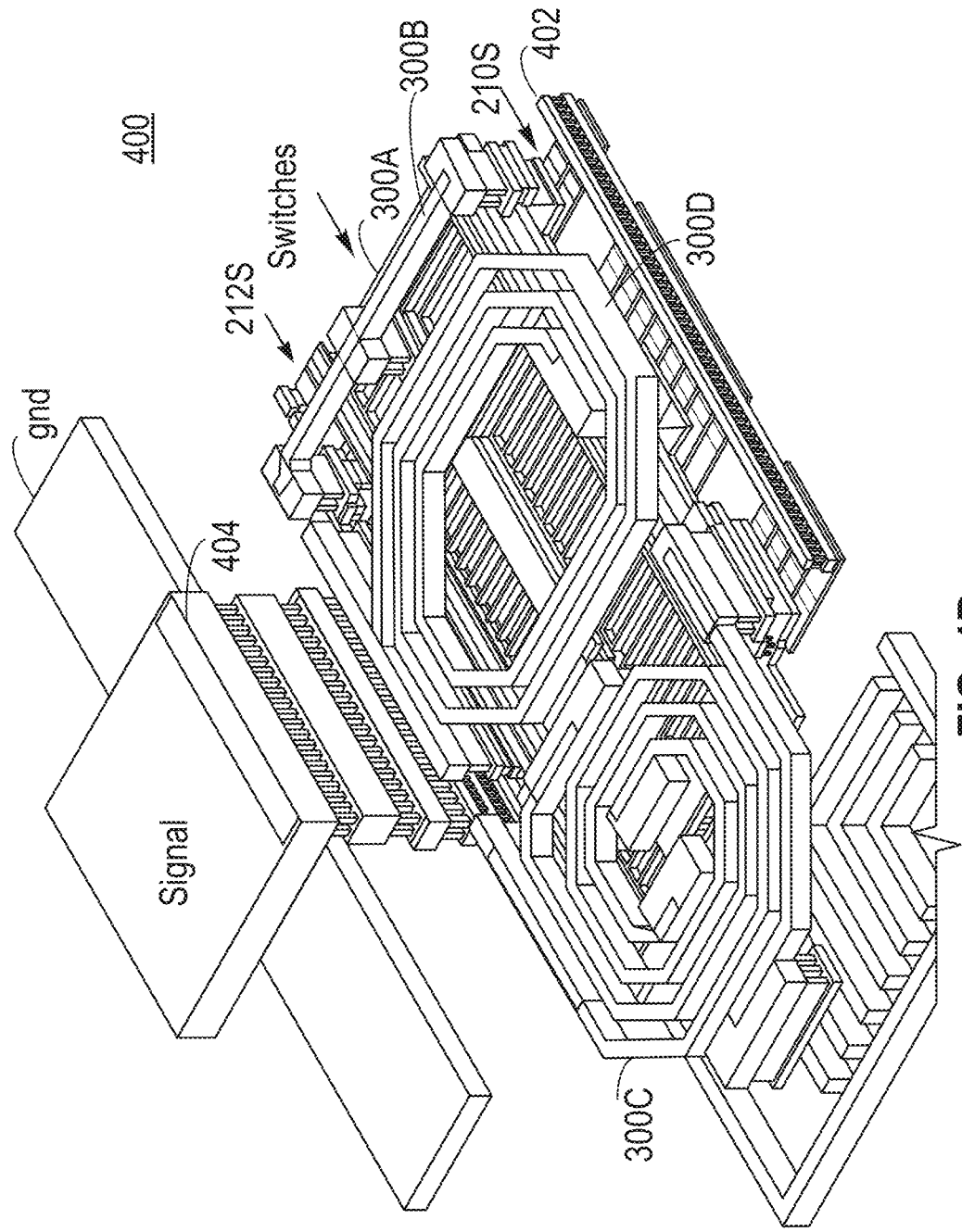
Figure 4C:
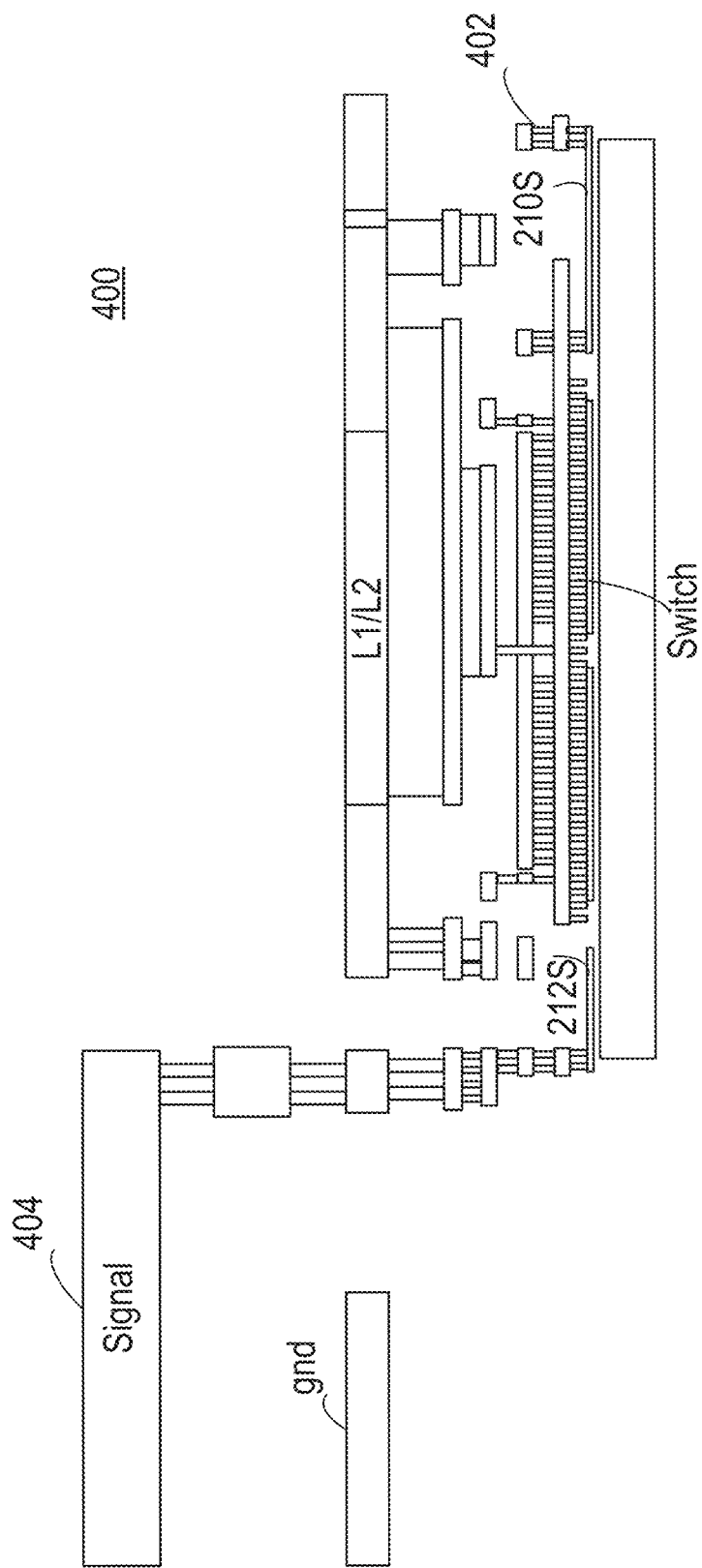

FIGS. 4A-4C illustrate a circuit layout diagram of an example variable termination resistor implemented by a plurality of variable termination resistor units comprising switches and T-coils.

FIG. 4A illustrates a top view of an example variable termination resistor 400. FIG. 4B illustrates three-dimensional (3D) view of the example variable termination resistor 400. FIG. 4C illustrates a side view of the example variable termination resistor 400. Not all components from FIG. 4A are shown in FIG. 4B and FIG. 4C.

In one or more examples, a variable termination resistor 400 may replace the termination resistor R1 or R0 in FIG. 1. FIGS. 4A-4C illustrate when the variable termination resistor 400 replaces the termination resistor R0, one end node 402 of the variable termination resistor 400 may be connected to the supply voltage Vcc. The node herein may include one or more nodes, one or more connection lines, one or more ports, or one or more connection pads. The other end node 404 of the variable termination resistor 400 may be connected to the transmission line (e.g., the transmission line 108 of FIG. 1) which transmits signals. A ground (gnd) connection is also shown in FIGS. 4A-4C.

The variable termination resistor 400 may include a plurality of variable termination resistor units. In one or more examples, the variable termination resistor 400 may include four variable termination resistor units 300A, 300B, 300C and 300D (also shown in FIG. 3). In some other embodiments, the number of variable termination resistor units in the variable termination resistor 400 is not limited to 4 and may be dependent on the number of bits of a symbol in the signal stream The variable termination resistor 400 may include substantially the same or similar structure and functionality as the variable termination resistor 300 as shown in FIG. 3.

As shown in FIGS. 4A-4C and as described in FIG. 3, the variable termination resistor unit 300D may have the smallest resistance for processing the MSB. The variable termination resistor unit 300D may have the biggest T-coil 208D among the four T-coils of the four variable termination resistor units 300A, 300B, 300C and 300D. The T-coil 208D may have the largest capacitance Cb formed between L1 and L2 of the T-coil 208D among the T-coils the four variable termination resistor units 300A, 300B, 300C and 300D.

The center tap terminal ct of the T-coil 208D may connect to the switch 206D (noting that the structure of the switch 206D is not fully shown in FIGS. 4A-4C). The switch 206D may have the smallest resistance among the switches of the four variable termination resistor units 300A, 300B, 300C and 300D.

The second terminal p2 of the T-coil 208D may connect to the resistor 212D which may also connect to the transmission line (e.g., the transmission line 108 of FIG. 1). In one or more examples, as shown in FIGS. 4A-4C, the resistor 212D may include one or more resistor strips 212S in parallel. The resistance of the resistor 212D may be inverse proportional to the number of resistor strips 212S connected in parallel. For processing the MSB, the variable termination resistor unit 300D may have the biggest number of resistor strips 212S included in the resistor 212D among the four variable termination resistor units 300A, 300B, 300C and 300D.

The first terminal p1 of the T-coil 208D may connect to the resistor 210D which may also connect to the supply voltage Vcc (e.g., Vcc of FIG. 1). In one or more examples, as shown in FIGS. 4A-4C, the resistor 210D may include one or more resistor strips 210S in parallel. The resistance of the resistor 210D may be inverse proportional to the number of resistor strips 210S connected in parallel. For processing the MSB, the variable termination resistor unit 300D may have the biggest number of resistor strips 210S included in the resistor 210D among the four variable termination resistor units 300A, 300B, 300C and 300D.

The variable termination resistor unit 300C may have substantially similar structure, and connections and functionality as the variable termination resistor unit 300D. Compared with the variable termination resistor unit 300D, the variable termination resistor unit 300C may include a T-coil 208C with a larger inductance connected to a switch 206C with a bigger resistance, the resistor 212C with a bigger resistance including a smaller number of resistor strips 212S, and the resistor 210C with a bigger resistance including a smaller number of resistor strips 210S. In one or more examples, the number of resistor strips 212S included in the resistor 212C may be substantially half of the number of resistor strips 212S included in the resistor 212D. The number of resistor strips 210S included in the resistor 210C may be substantially half of the number of resistor strips 210S included in the resistor 210D.

The variable termination resistor unit 300B may have substantially similar structure, and connections and functionality as the variable termination resistor unit 300C. Compared with the variable termination resistor unit 300C, the variable termination resistor unit 300B may include a T-coil 208B with a larger inductance connected to a switch 206B with a bigger resistance, the resistor 212B with a bigger resistance including a smaller number of resistor strips 212S, and the resistor 210B with a bigger resistance including a smaller number of resistor strips 210S. In one or more examples, as shown in FIGS. 4A-4C, since only a smaller parasitic capacitance and a larger inductance are needed, the shape of the T-coil 208B may be a straight strip instead of the coiled structures for T-coils 208C and 208D. In one or more examples, the number of resistor strips 212S included in the resistor 212B may be substantially half of the number of resistor strips 212S included in the resistor 212C. The number of resistor strips 210S included in the resistor 210B may be substantially half of the number of resistor strips 210S included in the resistor 210C.

The variable termination resistor unit 300A (components not fully shown FIGS. 4A-4C because of a small size) may have substantially similar structure, and connections and functionality as the variable termination resistor unit 300B. Compared with the variable termination resistor unit 300B, the variable termination resistor unit 300A may include T-coil 208A with a larger inductance connected to a switch 206A with a bigger resistance, the resistor 212A with a bigger resistance including a smaller number of resistor strips 212S, and the resistor 210A with a bigger resistance including a smaller number of resistor strips 210S. In one or more examples, as shown in FIGS. 4A-4C, since only a smaller parasitic capacitance and a larger inductance are needed, no T-coil 208A or a small T-coil 208A may be needed instead of strip structure for T-coil 208B, or the coiled structures for T-coils 208C and 208D. In one or more examples, the number of resistor strips 212S included in the resistor 212A may be substantially half of the number of resistor strips 212S included in the resistor 212B. The number of resistor strips 210S included in the resistor 210A may be substantially half of the number of resistor strips 210S included in the resistor 210B.

In one or more examples, as shown in FIGS. 4B and 4C, the end node 404 may be located on a top layer of a chip including the variable termination resistor 400. The T-coils 208A, 208B, 208C, 208D, and ground (gnd) may be disposed on a middle layer of the chip. The switches 206A, 206B, 206C, and 206D, and resistor strips (e.g., 210S, and 212S) may be disposed in a near bottom layer of the chip.

Figure 5:
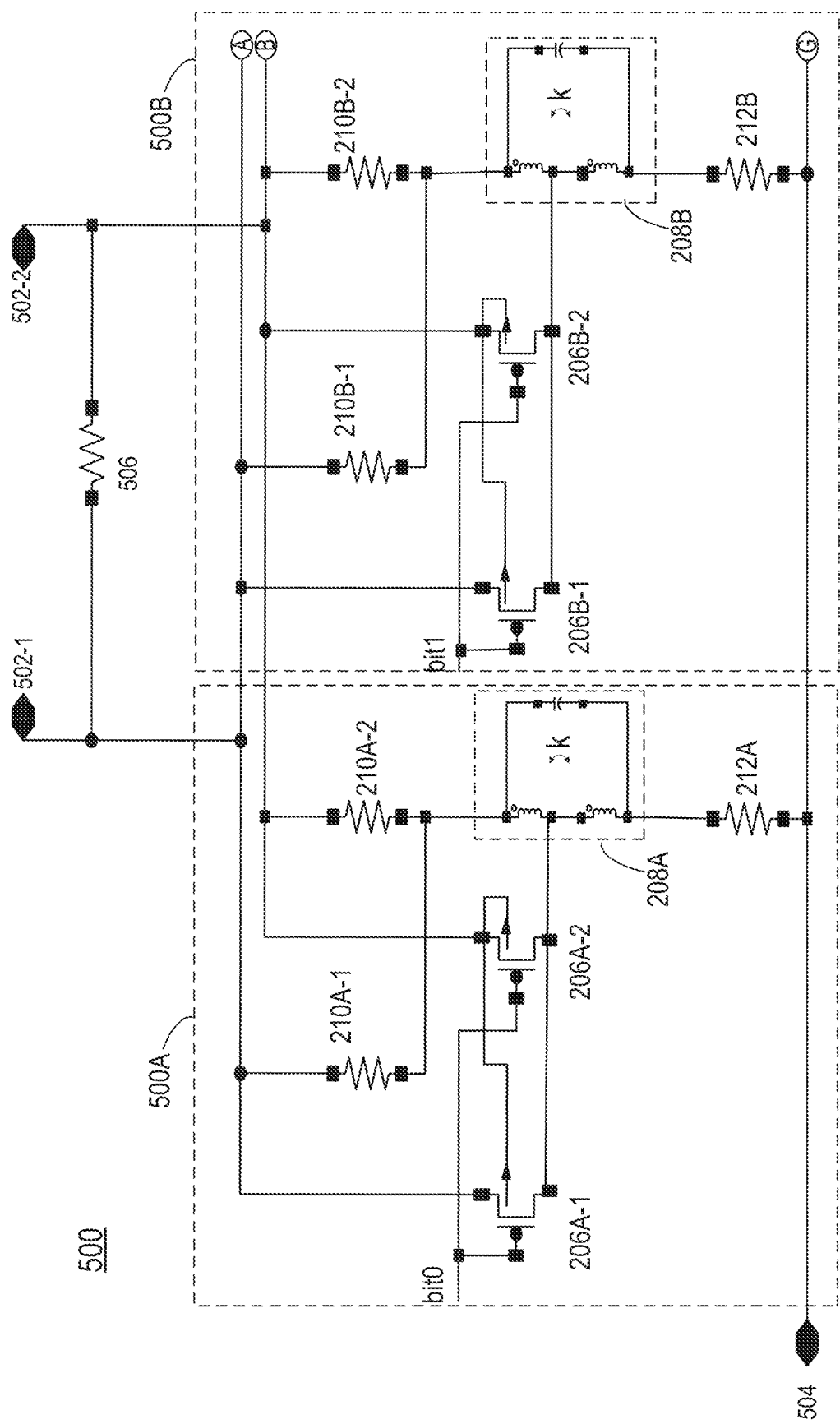
FIG. 5 illustrates a circuit diagram of an example variable termination resistor implemented by a plurality of variable termination resistor units comprising switches and T-coils.
Figure 5:
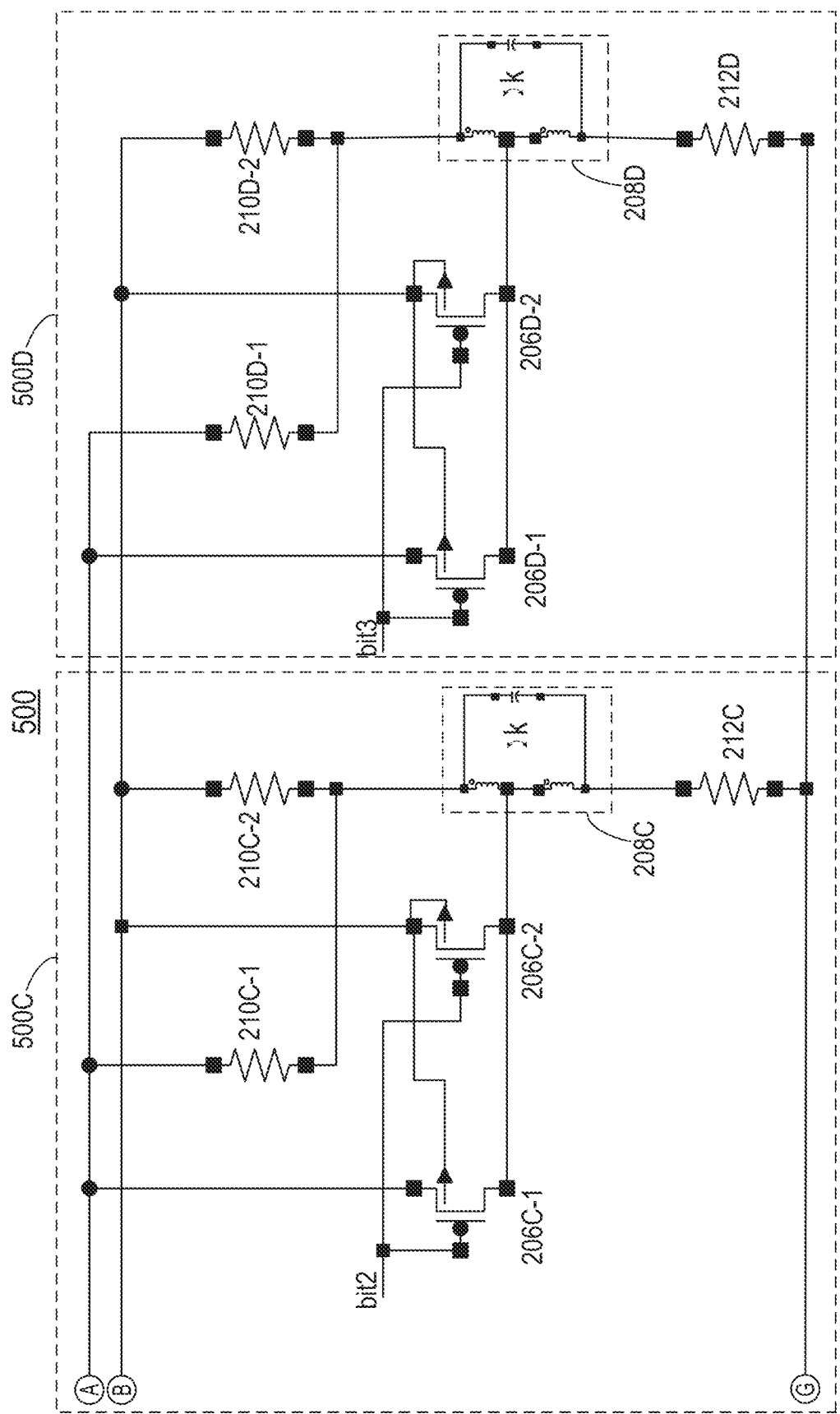

FIG. 5 illustrates a circuit diagram of an example variable termination resistor implemented by a plurality of variable termination resistor units comprising switches and T-coils.

In one or more examples, a variable termination resistor 500 may replace the termination resistor R1 or R0 in FIG. 1. When the variable termination resistor 300 replaces the termination resistor R1, the end nodes 502-1 and 502-2 of the variable termination resistor 500 may be connected to the ground. The other end node 504 of the variable termination resistor 500 may be connected to the transmission line (e.g., the transmission line 110 of FIG. 1) which transmits signals. When the variable termination resistor 500 replaces the termination resistor R0, the end nodes 502-1 and 502-2 of the variable termination resistor 500 may be connected to the supply voltage Vcc. The other end node 504 of the variable termination resistor 500 may be connected to the transmission line (e.g., the transmission line 108 of FIG. 1) which transmits signals. In one or more examples, the end nodes 502-1 and 502-2 may be connected to separates nodes along the same connection line from the variable termination resistor 500 to the ground or the supply voltage Vcc. In some examples, a small resistor (e.g., 1-100 ohms) may be connected between the end nodes 502-1 and 502-2. The two end nodes 502-1 and 502-2 may be implemented to decouple an external capacitance and/or inductance of an external component from an internal capacitance and/or inductance, and to reduce external resonance to the variable termination resistor 500.

The variable termination resistor 500 may include a plurality of variable termination resistor units. In one or more examples, the variable termination resistor 500 may include four variable termination resistor units 500A, 500B, 500C and 500D. In some other embodiments, the number of variable termination resistor units in the variable termination resistor 500 is not limited to 4 and may be dependent on the number of bits of a symbol in the signal stream. Each of the components within each of the variable termination resistor units 500A, 500B, 500C and 500D may include substantially the same or similar structure and functionality as each of the components within the variable termination resistor 200 of FIG. 2. For example, the variable termination resistor unit 500A may include substantially the same or similar resistor 210A-1, resistor 212A, switch 206A-1, and T-coil 208A as the resistor 210, resistor 212, switch 206, and T-coil 208, respectively.

The plurality of variable termination resistor units 500A, 500B, 500C and 500D may include substantially the same or similar structure and functionality as the variable termination resistor units 300A, 300B, 300C and 300D, respectively of FIG. 3. The difference between variable termination resistor 300 and 500 is that each of the variable termination units, for example the variable termination resistor unit 500A, may include two resistors 210A-1 and 210A-2, and two switches 206A-1 and 206A-2. One end of the resistor 210A-1 may be connected to the end node 501-1. One end of the resistor 210A-2 may be connected to the end node 501-2. The other ends of the resistors 210A-1 and 210A-2 may be connected together and also connected to the first terminal p1 of the T-coil 208A. One end of the switch 206A-1 may be connected to the end node 501-1. One end of the switch 206A-2 may be connected to the end node 501-2. The other ends of the switches 206A-1 and 206A-2 may be connected together and also connected to the center tap terminal ct of the T-coil 208A. The second terminal p2 of the T-coil 208A may be connected to the resistor 212A which may further connect to the end node 504.

In FIG. 5, each of the four variable termination resistor units 500A, 500B, 500C and 500D may be configured to process each bit of a 4-bit symbol in the signal stream. In one or more examples, the currently processed bit may be trimmed from the symbol and supplied to the gate of each of the switches 206A-1, 206A-2, 206B-1, 206B-2, 206C-1, 206C-2, 206D-1, and 206D-2. Switches (e.g., 206A-1, 206A-2) within the same variable termination (e.g., 500A)

unit may share the same bit input. The output signal from each of the four variable termination resistor units 500A, 500B, 500C and 500D may be binary weighted at the end nodes 502-1, 502-2 and 504 of the variable termination resistor 500.

In one or more examples, the resistances of the resistors (e.g. 210A-1, 210A-2, 212A-1 and 212A-2), the resistance of the switches (e.g., 206A-1 and 206A-2), the capacitance and inductance of the T-coil (208A) of each of the variable termination resistor units (e.g., 500A) may be determined according to the current processed bit of the N-bit symbol similar as described in FIG. 3. In some examples, for each of the variable termination resistor units of FIG. 5, each resistance of the resistors (e.g., 210A-1, 210A-2) and switches (e.g., 206A-1 and 206A-2) may be twice of respective resistance of the resistor (e.g. 210A) and switch (e.g., 206A) of FIG. 3 to achieve substantially the same total resistance for the variable termination resistors 300 and 500.

In some approaches, the values of a termination resistor may be adjusted by switches without T-coils, the parasitic capacitance of the switches may impact the impedance of the termination resistor at different frequencies and degrade the performance of the signal driver. For example, the impedance of the termination resistor may be lower at a high frequency range with poor performance. The resistors within the termination resistor may have changed impedances at low frequencies.

By integrating a T-coil to a switch in a termination resistor, the output impedance from the signal driver (e.g., 104) may be constant/stable across a broad frequency range, e.g., from DC up to 13 GHz frequency.

In one or more examples, the output impedance from the signal driver (e.g., 104) may be programed through a feedback control to stay constant, for example, through controlling the impedance/resistance of the variable termination resistors (e.g., 200 of FIG. 2, and 300 of FIG. 3). The impedance/resistance of the variable termination resistors may be tuned across the broad frequency range, e.g., from DC up to 13 GHz frequency.

In one or more examples, the resistance/impedance of the variable termination resistor may be measured. A feedback control may be programmed according to the measurement to adjust the resistance/impedance of the variable termination resistor to a predetermined/optimal value. In some examples, the resistance/impedance of the variable termination resistor may be adjusted to keep the output impedance of the signal driver relatively constant within a tolerance range.

The variable termination resistor may be programmed to vary to meet the tolerance range of the off-chip transmission line impedance variation (e.g., a printed circuit board (PCB) transmission line), and to compensate for the resistor variation within the variable termination resistor.

In one or more aspects, a chip may be a semiconductor chip, a circuit chip, an integrated circuit (IC), or an IC chip. In one or more aspects, a signal may include one or more signals. For example, a differential signal may include differential signals. An input signal may include one or more input signals. An output signal may include one or more output signals. An input may sometimes refer to an input signal. An output may sometimes refer to an output signal. An input may include one or more inputs. An output may include one or more outputs. A line may include one or more lines. A transmission line may include one or more transmission lines. In some examples, a node may include one or more nodes. While a supply voltage Vcc is illustrated as a high supply voltage, and the ground is illustrated as a low supply voltage, the subject technology is not limited to thereto. In one or more examples, a supply voltage can be a positive supply voltage, the ground, or a negative supply voltage.

Various example embodiments and aspects of the disclosure are described below for convenience. These are provided as examples, and do not limit the subject technology. Some of the examples described below are illustrated with respect to the figures disclosed herein simply for illustration purposes without limiting the scope of the subject technology.

One or more implementations provide a signal driver (e.g., 104 of FIG. 1). The signal driver includes: a variable termination resistor (e.g., R0 or R1 of FIG. 1, 200 of FIG. 2, 300 of FIG. 3, 400 of FIGS. 4A-4C, or 500 of FIG. 5), and a signal transmission line (e.g., 108 and/or 110 of FIG. 1). The variable termination resistor includes one or more variable termination resistor units (e.g., 300A, 300B. 300C, or/and 300D of FIG. 3 and/or FIGS. 4A-4C, or 500A, 500B. 500C, or/and 500D of FIG. 5), each including: a switch (e.g., 206 of FIG. 2) connected to a first end node (e.g., 202 of FIG. 2) of the variable termination resistor; a T-coil (e.g., 208 of FIG. 2) connected to the switch; a first resistor (e.g., 210 of FIG. 2) connected to the first end node of the variable termination resistor and to the T-coil; and a second resistor (e.g., 212 of FIG. 2) connected to a second end node (e.g., 204 of FIG. 2) of the variable termination resistor and to the T-coil. In one or more examples, the signal transmission line is connected to the second end node of the variable termination resistor.

In one or more examples, the first end node of the variable termination resistor is configured to be connected to a ground (e.g., gnd of FIG. 1) or a supply voltage (e.g., Vcc of FIG. 1).

In one or more examples, the T-coil includes: a first inductor (e.g., L1 of FIG. 2); a second (e.g., L2 of FIG. 2) inductor; and a bridge capacitor (e.g., Cb of FIG. 2) formed by coupling of the first inductor and the second inductor. In one or more examples, the first inductor is disposed between a first terminal (e.g., p1 of FIG. 2) and a center tap terminal (e.g., ct of FIG. 2) of the T-coil, and the second inductor is disposed between a second terminal (e.g., p2 of FIG. 2) and the center tap terminal of the T-coil.

In one or more examples, the first resistor is disposed between the first terminal and the first end node of the variable termination resistor, and the second resistor is disposed between the second terminal and the second end node of the variable termination resistor.

In one or more examples, the signal driver further includes: a second variable termination resistor (e.g., R0 or R1 of FIG. 1) connected to a second signal transmission line (108 or 110 of FIG. 1). In one or more examples, the variable termination resistor is a first variable termination resistor and the signal transmission line is a first signal transmission line, and the first signal transmission line and the second signal transmission line are differential signal lines.

In one or more examples, for each of the one or more variable termination resistor units: when the switch is turned on, each of the one or more variable termination resistor units has a first unit resistance, and when the switch is turned off, each of the one or more variable termination resistor units has a second unit resistance.

In one or more examples, the one or more variable termination resistor units include N variable termination resistor units; the variable termination resistor has $2^N$ resistance states; and N is a natural number.

In one or more examples, an incoming signal of the signal driver comprises a first bit (e.g., bit 0 of FIG. 3), and a second bit (e.g., bit 1 of FIG. 3); the one or more variable termination resistor units include a first variable termination resistor unit (e.g., 300A of FIG. 3) and a second variable termination resistor unit (e.g., 300B of FIG. 3); the first variable termination resistor unit is configured to process the first bit; and the second variable termination resistor unit is configured to process the second bit.

In one or more examples, the first bit is a least significant bit, and the second bit is a next bit to the left of the first bit in a bit symbol; a resistance of the first resistor (e.g., 210A of FIG. 3) of the first variable termination resistor unit is substantially twice of a resistance of the first resistor (e.g., 210B of FIG. 3) of the second variable termination resistor unit; and a resistance of the second resistor (e.g., 212A of FIG. 3) of the first variable termination resistor unit is substantially twice of a resistance of the second resistor (e.g., 212B of FIG. 3) of the second variable termination resistor unit.

In one or more examples, a resistance of the switch (e.g., 206A of FIG. 3) of the first variable termination resistor unit is substantially twice of a resistance of the switch (e.g., 206B of FIG. 3) of the second variable termination resistor unit; an inductance of the T-coil (e.g., 208A of FIG. 3) of the first variable termination resistor unit is substantially twice of an inductance of the T-coil (e.g., 208B of FIG. 3) of the second variable termination resistor unit; and a capacitance of the T-coil (e.g., Cb of 208A of FIG. 3) of the first variable termination resistor unit is substantially half of a capacitance of the T-coil (e.g., Cb of 208B of FIG. 3) of the second variable termination resistor unit.

In one or more examples, the switch comprises a metal oxide semiconductor field effect transistor (MOSFET).

One or more implementations provide a variable termination resistor, that includes one or more variable termination resistor units. Each of the one or more variable termination resistor units includes: a switch connected to a first end node of the variable termination resistor; a T-coil connected to the switch; a first resistor connected to the first end node of the variable termination resistor and to the T-coil; and a second resistor connected to a second end node of the variable termination resistor and to the T-coil.

In one or more examples, the first end node of the variable termination resistor is configured to be connected to a ground or a supply voltage, and the second end node of the variable termination resistor is connected to a signal transmission line.

In one or more examples, the T-coil includes: a first inductor; a second inductor; and a bridge capacitor formed by coupling of the first inductor and the second inductor. In one or more examples, the first inductor is disposed between a first terminal and a center tap terminal of the T-coil, and the second inductor is disposed between a second terminal and the center tap terminal of the T-coil.

In one or more examples, the first resistor is disposed between the first terminal and the first end node of the variable termination resistor, and the second resistor is disposed between the second terminal and the second end node of the variable termination resistor.

In one or more examples, for each of the one or more variable termination resistor units: when the switch is turned on, each of the one or more variable termination resistor units has a first unit resistance, and when the switch is turned off, each of the one or more variable termination resistor units has a second unit resistance.

In one or more examples, the one or more variable termination resistor units include N variable termination resistor units; the variable termination resistor has $2^N$ resistance states; and N is a natural number.

In one or more examples, an incoming signal of the signal driver comprises a first bit, and a second bit; the one or more variable termination resistor units include a first variable termination resistor unit and a second variable termination resistor unit; the first variable termination resistor unit is configured to process the first bit; and the second variable termination resistor unit is configured to process the second bit.

In one or more examples, the first bit is a least significant bit, and the second bit is a next bit to the left of the first bit in a bit symbol; a resistance of the first resistor of the first variable termination resistor unit is substantially twice of a resistance of the first resistor of the second variable termination resistor unit; and a resistance of the second resistor of the first variable termination resistor unit is substantially twice of a resistance of the second resistor of the second variable termination resistor unit.

One or more implementations provide a method of providing a signal driver that comprises: providing a variable termination resistor: and providing a signal transmission line connected to a second end node of the variable termination resistor. In one or more examples, providing the variable termination resistor comprises providing each of one or more variable termination resistor units of the variable termination resistor that includes: connecting a switch to a first end node of the variable termination resistor; connecting a T-coil to the switch; connecting a first resistor to the first end node of the variable termination resistor and to the T-coil; and connecting a second resistor connected to the second end node of the variable termination resistor and to the T-coil.

In one or more aspects, a method includes one or more methods, operations or portions thereof described herein. In one or more aspects, an apparatus includes one or more memories and one or more processors, the one or more processors configured to cause performing one or more methods, operations or portions thereof described herein. In one or more aspects, an apparatus includes means adapted for performing one or more methods, operations or portions thereof described herein. In one or more aspects, a hardware apparatus includes circuits configured to perform one or more methods, operations or portions thereof described herein. In one or more aspects, an apparatus includes components operable to carry out one or more methods, operations or portions thereof described herein. In one or more aspects, anon-transitory machine-readable storage medium (e.g., one or more memories and/or one or more registers) store instructions that, when executed by one or more processors, cause one or more processors to perform one or more methods, operations or portions thereof described herein.

Further examples of the subject technology include various subsets of the above examples combined or otherwise re-arranged in various forms.

In some examples, to illustrate the interchangeability of hardware and software, items such as the various illustrative blocks, modules, components, methods, operations, instructions, and algorithms may have been described generally in terms of their functionality. In some examples, whether such functionality is implemented as hardware, software or a combination of hardware and software depends upon the particular application and design constraints imposed on the overall system. Skilled artisans may implement the described functionality in varying ways for each particular application.

Headings and subheadings, if any, are used for convenience only and do not limit the invention. The word "exemplary" is used to mean serving as an example or illustration. Any implementation described herein as an "example" is not necessarily to be construed as preferred or advantageous over other implementations. Relational terms such as first and second and the like may be used simply for ease of understanding without necessarily requiring or implying any actual relationship or order between elements or actions and without necessarily requiring or implying that they have different characteristics unless stated otherwise.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" and "at least one of A, B, or C" may refer to only A, only B, or only C; any combination of A, B, and C; and/or at least one of each of A, B, and C.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In one aspect, the blocks or components described in this present disclosure may be implemented in circuits or integrated circuits. A circuit or an integrated circuit may include one or more transistors.

In one or more aspects, a transistor may include one or more bipolar junction transistors (BJTs), which may refer to any of a variety of multi-terminal transistors operating on the principal of carrying current using both electrons and holes, including, but not limited to, an n-p-n BJT (NPN BJT) and a p-n-p BJT (PNP BJT).

In one or more aspects, transistors may include one or more field effect transistors (FETs), which may refer to any of a variety of multi-terminal transistors operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET). A MOSFET may be an n-type MOSFET (NMOS) or a p-type MOSFET (PMOS). A complementary metal-oxide semiconductor (CMOS) device may include an NMOS and a PMOS.

In one or more aspects, transistors may include one or more BJTs and FETs. In one or more examples, transistors may include one or more BJTs and one or more CMOS devices, which may be referred to as Bi-CMOS devices.

Unless otherwise mentioned, various configurations described in the present disclosure may be implemented on a silicon, silicon-germanium (SiGe), gallium arsenide (GaAs), indium phosphide (InP) or indium gallium phosphide (InGaP) substrate, or any other suitable substrate.

In one aspect, the terms base, emitter, and collector may refer to three terminals of a transistor and may refer to a base, an emitter and a collector of a bipolar junction transistor or may refer to a gate, a source, and a drain of a field effect transistor, respectively, and vice versa. In another aspect, the terms gate, source, and drain may refer to base, emitter, and collector of a transistor, respectively, and vice versa. In some aspects, a source and a drain may be used interchangeably.

The transistors implemented herein are not limited thereto. In one or more examples, the transistors may include other types such as FETs and/or some combination of BJTs and FETs. Furthermore, in one or more examples, the transistors may include various types such as NPN BJTs, PNP BJTs, some types of FETs (e.g., NMOS or PMOS) and/or some combination thereof.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

In one or more examples, when an element is "connected" or "coupled" to another element, the element can be directly connected or coupled to another element, and can be indirectly connected or coupled to another element with one or more intervening elements disposed or interposed between the elements, unless otherwise specified.

The disclosure is provided to enable any person skilled in the art to practice the various aspects described herein. In some instances, when a detailed description of well-known functions or configurations may unnecessarily obscure aspects of the present disclosure, the detailed description thereof may have been omitted. The disclosure provides various examples of the subject technology, and the subject technology is not limited to these examples. Various modifications to these aspects will be readily apparent to those skilled in the art, and the principles described herein may be applied to other aspects.

Unless stated otherwise, like reference numerals refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

When the term "comprise," "have," "include," "contain," "constitute," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. An element proceeded by "a," "an," "the," or "said" does not, without further constraints, preclude the existence of additional elements.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, or the like). Furthermore, while the subject disclosure may provide many example ranges and values, these are non-limiting examples, and other ranges and values are within the scope of the subject technology.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A signal driver, comprising:
    a variable termination resistor, comprising:
        one or more variable termination resistor units, each including:
            a switch connected to a first end node of the variable termination resistor;
            a T-coil connected to the switch;
            a first resistor connected to the first end node of the variable termination resistor and to the T-coil; and
            a second resistor connected to a second end node of the variable termination resistor and to the T-coil; and
    a signal transmission line connected to the second end node of the variable termination resistor.

2. The signal driver according to claim 1, wherein the first end node of the variable termination resistor is configured to be connected to a ground or a supply voltage.

3. The signal driver according to claim 1,
    wherein the T-coil includes:
        a first inductor;
        a second inductor; and
        a bridge capacitor formed by coupling of the first inductor and the second inductor.

4. The signal driver according to claim 3, wherein the first resistor is disposed between a first terminal of the T-coil and the first end node of the variable termination resistor, and the second resistor is disposed between a second terminal of the T-coil and the second end node of the variable termination resistor.

5. The signal driver according to claim 1, further comprising:
a second variable termination resistor connected to a second signal transmission line,
wherein the variable termination resistor is a first variable termination resistor and the signal transmission line is a first signal transmission line, and the first signal transmission line and the second signal transmission line are differential signal lines.

6. The signal driver according to claim 1, wherein for each of the one or more variable termination resistor units: when the switch is turned on, each of the one or more variable termination resistor units has a first unit resistance, and when the switch is turned off, each of the one or more variable termination resistor units has a second unit resistance.

7. The signal driver according to claim 1, wherein
the one or more variable termination resistor units include N variable termination resistor units;
the variable termination resistor has $2^N$ resistance states; and
N is a natural number.

8. The signal driver according to claim 1, wherein
the signal driver is configured to receive an incoming signal comprising a first bit, and a second bit;
the one or more variable termination resistor units include a first variable termination resistor unit and a second variable termination resistor unit;
the first variable termination resistor unit is configured to process the first bit; and
the second variable termination resistor unit is configured to process the second bit.

9. The signal driver according to claim 8, wherein:
the first bit is a least significant bit, and the second bit is a next bit to a left of the first bit in a bit symbol;
a resistance of the first resistor of the first variable termination resistor unit is substantially twice of a resistance of the first resistor of the second variable termination resistor unit; and
a resistance of the second resistor of the first variable termination resistor unit is substantially twice of a resistance of the second resistor of the second variable termination resistor unit.

10. The signal driver according to claim 9, wherein:
a resistance of the switch of the first variable termination resistor unit is substantially twice of a resistance of the switch of the second variable termination resistor unit;
an inductance of the T-coil of the first variable termination resistor unit is substantially twice of an inductance of the T-coil of the second variable termination resistor unit; and
a capacitance of the T-coil of the first variable termination resistor unit is substantially half of a capacitance of the T-coil of the second variable termination resistor unit.

11. The signal driver according to claim 9, wherein the switch comprises a metal oxide semiconductor field effect transistor (MOSFET).

12. A variable termination resistor, comprising:
one or more variable termination resistor units, each including:
a switch connected to a first end node of the variable termination resistor;
a T-coil connected to the switch;
a first resistor connected to the first end node of the variable termination resistor and to the T-coil; and
a second resistor connected to a second end node of the variable termination resistor and to the T-coil,
wherein the T-coil includes:
a first inductor;
a second inductor; and
a bridge capacitor formed by coupling of the first inductor and the second inductor, and
wherein the first inductor is disposed between a first terminal and a center tap terminal of the T-coil, and the second inductor is disposed between a second terminal and the center tap terminal of the T-coil.

13. The variable termination resistor according to claim 12, wherein the first end node of the variable termination resistor is configured to be connected to a ground or a supply voltage, and the second end node of the variable termination resistor is connected to a signal transmission line.

14. The variable termination resistor according to claim 12, wherein the first resistor is disposed between the first terminal and the first end node of the variable termination resistor, and the second resistor is disposed between the second terminal and the second end node of the variable termination resistor.

15. The variable termination resistor according to claim 12, wherein for each of the one or more variable termination resistor units: when the switch is turned on, each of the one or more variable termination resistor units has a first unit resistance, and when the switch is turned off, each of the one or more variable termination resistor units has a second unit resistance.

16. The variable termination resistor according to claim 12, wherein
the one or more variable termination resistor units include N variable termination resistor units;
the variable termination resistor has $2^N$ resistance states; and
N is a natural number.

17. The variable termination resistor according to claim 12, wherein
a signal driver is configured to receive an incoming signal comprising a first bit, and a second bit;
the one or more variable termination resistor units include a first variable termination resistor unit and a second variable termination resistor unit;
the first variable termination resistor unit is configured to process the first bit; and
the second variable termination resistor unit is configured to process the second bit.

18. The variable termination resistor according to claim 17, wherein:
the first bit is a least significant bit, and the second bit is a next bit to a left of the first bit in a bit symbol;
a resistance of the first resistor of the first variable termination resistor unit is substantially twice of a resistance of the first resistor of the second variable termination resistor unit; and
a resistance of the second resistor of the first variable termination resistor unit is substantially twice of a resistance of the second resistor of the second variable termination resistor unit.

19. A method of providing a signal driver, comprising:
providing a variable termination resistor: and
providing a signal transmission line connected to a second end node of the variable termination resistor;

wherein providing the variable termination resistor comprising:
  providing each of one or more variable termination resistor units of the variable termination resistor, including:
    connecting a switch to a first end node of the variable termination resistor;
    connecting a T-coil to the switch;
    connecting a first resistor to the first end node of the variable termination resistor and to the T-coil; and
    connecting a second resistor connected to the second end node of the variable termination resistor and to the T-coil.

\* \* \* \* \*